US 6,734,733 B2

(12) United States Patent
Rydin (10) Patent No.: US 6,734,733 B2
(45) Date of Patent: May 11, 2004

(54) AUXILIARY AMPLIFIER IN FEEDFORWARD LINEARIZATION AMPLIFICATION SYSTEM

(75) Inventor: Arne Rydin, Fjärdhundra (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 92 days.

(21) Appl. No.: 10/163,642

(22) Filed: Jun. 7, 2002

(65) Prior Publication Data

US 2003/0227325 A1 Dec. 11, 2003

(51) Int. Cl.[7] .............................. H03F 3/66; H03F 1/26
(52) U.S. Cl. ........................ 330/149; 330/151
(58) Field of Search ................ 330/149, 151, 330/10, 163

(56) References Cited

U.S. PATENT DOCUMENTS

| 5,770,971 A | * 6/1998 | McNicol ..................... 330/149 |
| 5,877,653 A | 3/1999 | Kim et al. |
| 6,075,411 A | 6/2000 | Briffa et al. |
| 6,266,517 B1 | 7/2001 | Fitzpatrick et al. |
| 6,271,724 B1 | 8/2001 | Neffling |

FOREIGN PATENT DOCUMENTS

JP  230636  * 8/2001

OTHER PUBLICATIONS

European Search Report mailed Jan. 7, 2003.

* cited by examiner

Primary Examiner—Michael B. Shingleton
(74) Attorney, Agent, or Firm—Nixon & Vanderhye, P.C.

(57) ABSTRACT

An amplifier system (120) for radio frequency signals comprises a combination of a phase and gain adjuster (122) and a first amplifier (123) which receives an input signal and generates a first amplified signal having a gain adjusted in accordance with a gain of the phase and gain adjuster. A main amplifier (126) receives the first amplified signal and generates a second amplified signal. A first controller (134) uses a signal derived from the second amplified signal to generate a first control signal. The first control signal is applied to the phase and gain adjuster to control the gain of the phase and gain adjuster. A second controller (170) is connected to receive the first control signal and to generate a second control signal which is applied to the first amplifier. The second control signal is generated to control the first control signal and thereby control noise of the amplifier system. With the second control signal being used to control the first control signal, the phase and gain adjuster (122) can adjust the adjusted signal to make adjustments for a first type of gain variation of the amplifier system.

22 Claims, 5 Drawing Sheets

AUXILIARY AMPLIFIER IN FEEDFORWARD LINEARIZATION AMPLIFICATION SYSTEM

This application is related to the following simultaneously-filed United States Patent Application: U.S. patent application Ser. No. 10/163,643, entitled "COORDINATE ROTATION OF PREDISTORTION VECTOR IN FEEDFORWARD LINEARIZATION AMPLIFICATION SYSTEM"; which is incorporated herein by reference in its entirety.

BACKGROUND

1. Field of the Invention

The present invention pertains to linear amplification of RF signals, for example linear amplification of RF signals using a multicarrier amplifier.

2. Related Art and Other Considerations

Amplifiers are typically employed to amplify RF signals in order to provide, e.g., increased power for transmission purposes, particularly transmission over an air interface to a receiver such as (for example) a mobile station (e.g., a user equipment unit (UE) such as a cell phone). But in amplifying an input RF signal, the amplifier may add unwanted components due to non-linear characteristics of the amplifier. Such is particularly true when the type of amplifier utilized is chosen for its power efficiency and/or when plural continuous wave RF input signals are applied to the amplifier. Rather than just producing amplified signals corresponding input signals, such amplifier may also output certain additional signals related to the frequencies of the input signals. In this regard, mathematically the output of the amplifier can be expressed as a DC term; a fundamental term (which includes nominal gain for the input signals and an amplitude distortion); and (typically second and third) harmonics terms. The DC term and harmonics can usually be filtered out rather easily, leaving a passband.

The distortion within the passband is not easily removed, but rather is minimized by designing the overall amplifier system in order to compensate for the non-linear characteristics of the amplifier component per se. Such "linearization" of an amplifier system is important in order to avoid distorted signal trajectories and to avoid errors in determining the logic level of individual digital signals.

There are many techniques that can be used to linearize amplifiers. Among the linearization techniques are the following: Back off (in the case of Class A amplifiers); Feedforward; Vector summation; Predistortion, and Feedback. Several of these linearization techniques are briefly described in U.S. Pat. No. 6,075,411 to Briffa et al., which is incorporated herein by reference in its entirety. See also, in this regard, Briffa, Mark, "Linearisation of RF Power Amplifiers," 1996.

The feedforward technique is advantageous for broadband linear RF amplifier systems. As mentioned briefly above, since the multicarrier input signal is distorted by the non-linearities in the main amplifier, certain intermodulation (IM) products appear at the output. In essence, the feedforward technique generates an error signal by comparing the input signal with the main amplifier output. The error signal is subtracted from the main amplifier output, leaving a (nearly) distortion-free amplified signal.

Figure 1:
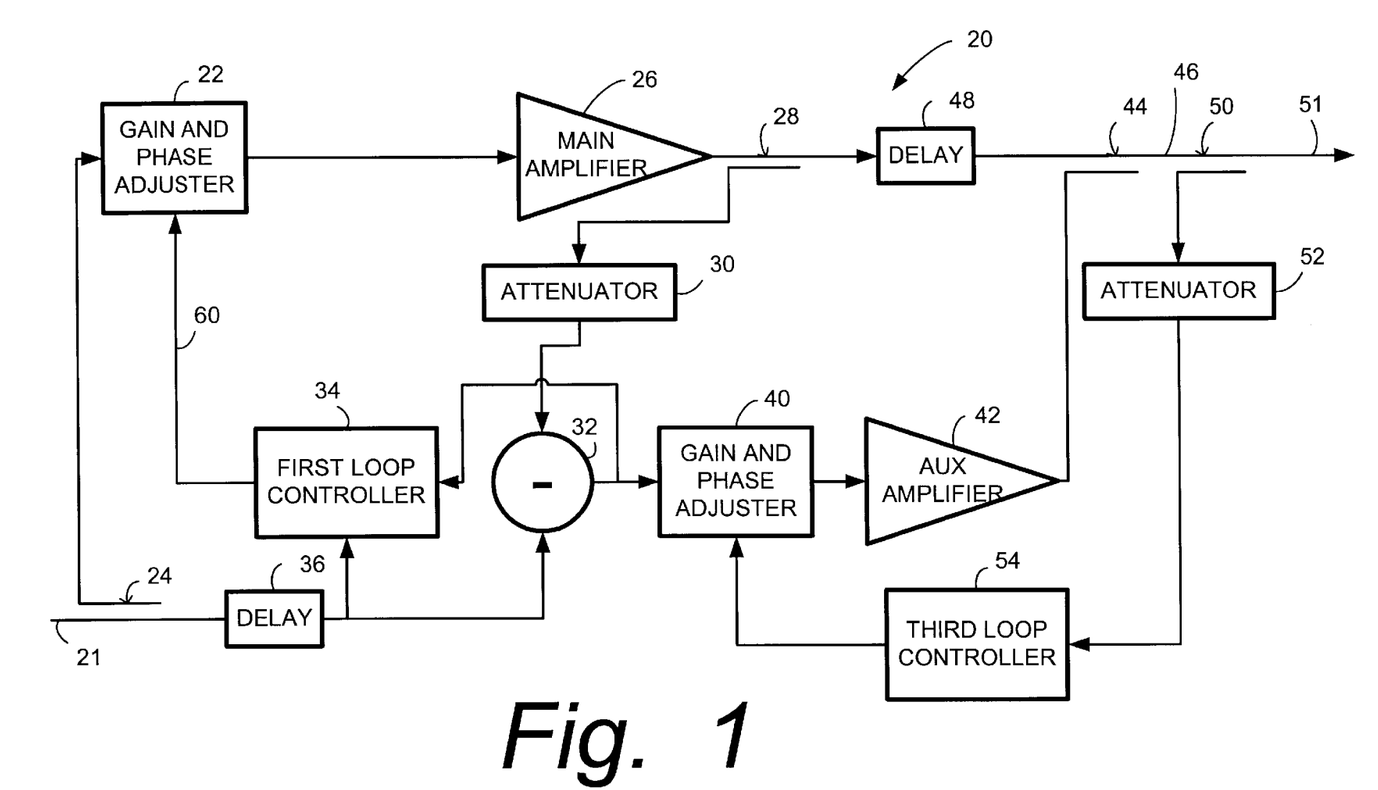
FIG. 1 is diagrammatic view of a conventional amplifier system which employs a feedforward technique.

FIG. 1 illustrates a simplified, example amplifier system 20 which employs a feedforward technique to minimize distortion. The amplifier system 20 comprises a phase and gain adjuster 22 which receives, via coupler 24, an input signal. Output from the phase and gain adjuster 22 is applied to main power amplifier 26. Output from main power amplifier 26 is applied to a coupler 28, and from one leg of coupler 28 via attenuator 30 to subtractor 32. Both subtractor 32 and first loop controller 34 receive, via delay 36, the input signal as obtained from coupler 24. Output from subtractor 32 is applied both to first loop controller 34 and to a second gain and phase adjuster 40. Output from gain and phase adjuster 40 is applied to auxiliary amplifier 42, whose amplified output is coupled by coupler 44 to line 46. Line 46 emanates from coupler 28 and delay 48. The output signal carried on line 46 at point 51 is applied via coupler 50 and attenuator 52 to third loop controller 54, with third loop controller 54 connected to control gain and phase adjuster 40.

Being in a simplified form for sake of illustration, the amplifier system 20 of FIG. 1 comprises three loops. A first loop of amplifier system 20 includes phase and gain adjuster 22, main power amplifier 26, coupler 28, attenuator 30, and subtractor 32. If the gain and phase shift through phase and gain adjuster 22, main power amplifier 26, and attenuator 30 equals the gain and phase shift through delay 36, an error signal indicative of the distortion of main power amplifier 26 is output by subtractor 32. But in order to equalize gain and phase shift through these paths, first loop controller 34 is used to produce control signals, applied on line 60, to phase and gain adjuster 22.

A second loop of amplifier system 20 comprises attenuator 30, subtractor 32, gain and phase adjuster 40, auxiliary amplifier 42, coupler 44, and delay 48. If the gain and phase shift through attenuator 30, subtractor 32, gain and phase adjuster 40, and auxiliary amplifier 42 equals the gain and phase shift through delay 48, except for a 180 degree phase shift, the distortion is added in opposite phase at coupler 44, thus canceling out the distortion of main power amplifier 26 on line 46. A third loop including attenuator 52 and third loop controller ensures phase and gain equality in these two paths.

Thus, the first loop described above with reference to amplifier system 20 creates an error signal which contains the intermodulation distortion from the main power amplifier 26. The second loop serves to cancel intermodulation distortion at output point 51, while leaving the carriers unaffected.

The characteristics of the components, especially of the power amplifier, can vary considerably due to manufacturing tolerances, temperature changes, and aging. Gain variations of several decibels (dB) are not uncommon. A system as described above can, in principle, accommodate for any gain change, with the phase and gain adjuster compensating for the gain variation. This means, however, that the full dynamic range of the phase and gain adjuster cannot be utilized.

In the above regard, a four-quadrant quadrature phase and gain adjuster has, in general, a relatively high output noise level with the noise being more or less independent of the gain setting. There are exceptions, such as phase and gain adjusters comprising Gallium Arsenide or PIN-diode components. However, the Gallium Arsenide-employing phase and gain adjusters are considerably more expensive than a noiser phase and gain adjuster fabricated with silicon technology. A PIN-diode type phase and gain adjuster may be too slow in its control function for many applications.

In general, a silicon-based phase and gain adjuster typically has 6–10 dB higher output noise than a variable gain amplifier for the same current drain. As an example illustration of this general proposition, assume that a silicon-base phase and gain adjuster in a control range of 6 dB has an output signal to noise ratio of 150 dB at maximum gain. When the gain is 6 dB down, the signal to noise ratio falls to 144 dB. On the other hand, a variable gain amplifier operating in the 6 dB control range would likely have an output signal to noise ratio of 158 dB at maximum gain, and a signal to noise ratio of 152 dB when the gain is 6 dB down.

Undesirable noise attending amplifier performance is significant in various applications, such as (for example) wireless telephony. In this regard, specifications for mobile phone systems typically restrict the amount of noise produced by a transmitter outside the transmitting channel, especially in the receiving band. If the undesired noise can be sufficiently limited, costly and space consuming noise rejection filters can be avoided.

Since the phase and gain adjuster is critical for dynamic range, some other form of gain control has to be employed in order to limit noise. This other form of gain control can be, for example, manufacturing adjustments. Measuring the temperature characteristics and insertion of some element with opposite temperature characteristics can compensate for the variations caused by temperature changes. In some cases, every individual system has to be characterized and calibrated, adding cost to the overall system.

What is needed, therefore, and an object of the present invention, is a simple technique for minimizing or lowering output noise of an amplifier system for radio communications.

BRIEF SUMMARY

An amplifier system for radio frequency signals comprises a combination of a phase and gain adjuster and a first amplifier. The combination receives an input signal and generates a first amplified signal having a gain adjusted in accordance with a gain of the phase and gain adjuster. The first amplifier is preferably a variable gain amplifier. A main amplifier (e.g., second amplifier) receives the first amplified signal and generates a second amplified signal. A first controller uses a signal derived from the second amplified signal to generate a first control signal. The first control signal is applied to the phase and gain adjuster to control the gain of the phase and gain adjuster. A second controller is connected to receive the first control signal and to generate a second control signal which is applied to the first amplifier. The second control signal is generated by the second controller ultimately to control the first control signal and thereby control noise of the amplifier system.

With the second control signal being used to control the first control signal, the phase and gain adjuster (which receives the first control signal) can adjust the adjusted signal to make adjustments for a first type of gain variation of the amplifier system. The second control signal is used to enable the first amplifier to change its first amplifier signal to make adjustments for a second type of gain variation of the amplifier system. For example, the first type of gain variation handled by the phase and gain adjuster can be a fast gain variation, and the second type of gain variation handled by the second amplifier can be a slow gain variation. The second type of gain variation can be, for example, a gain variation attributable to one of amplifier system production differences, aging, and temperature variations.

In one aspect, the second controller generates the second control signal so that the first control signal is maintained essentially constant. In one example mode, the second controller generates the second control signal so that a magnitude of the first control signal is maintained essentially constant. In another example mode, the second controller generates the second control signal so that a sum of absolute values of components the first control signal is maintained essentially constant. In yet another example mode, the second controller generates the second control signal so that an absolute value of a large component of the first control signal is maintained essentially constant.

The amplifier system includes further aspects, such as means for producing an error signal indicative of distortion of the main amplifier, and a distortion compensation circuit which uses the error signal essentially to cancel the distortion of the main amplifier in the second amplified signal (e.g., the output of the main amplifier).

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail. Moreover, individual function blocks are shown in some of the figures. Those skilled in the art will appreciate that the functions may be implemented using individual hardware circuits, using software functioning in conjunction with a suitably programmed digital microprocessor or general purpose computer, using an application specific integrated circuit (ASIC), and/or using one or more digital signal processors (DSPs).

Figure 2A:
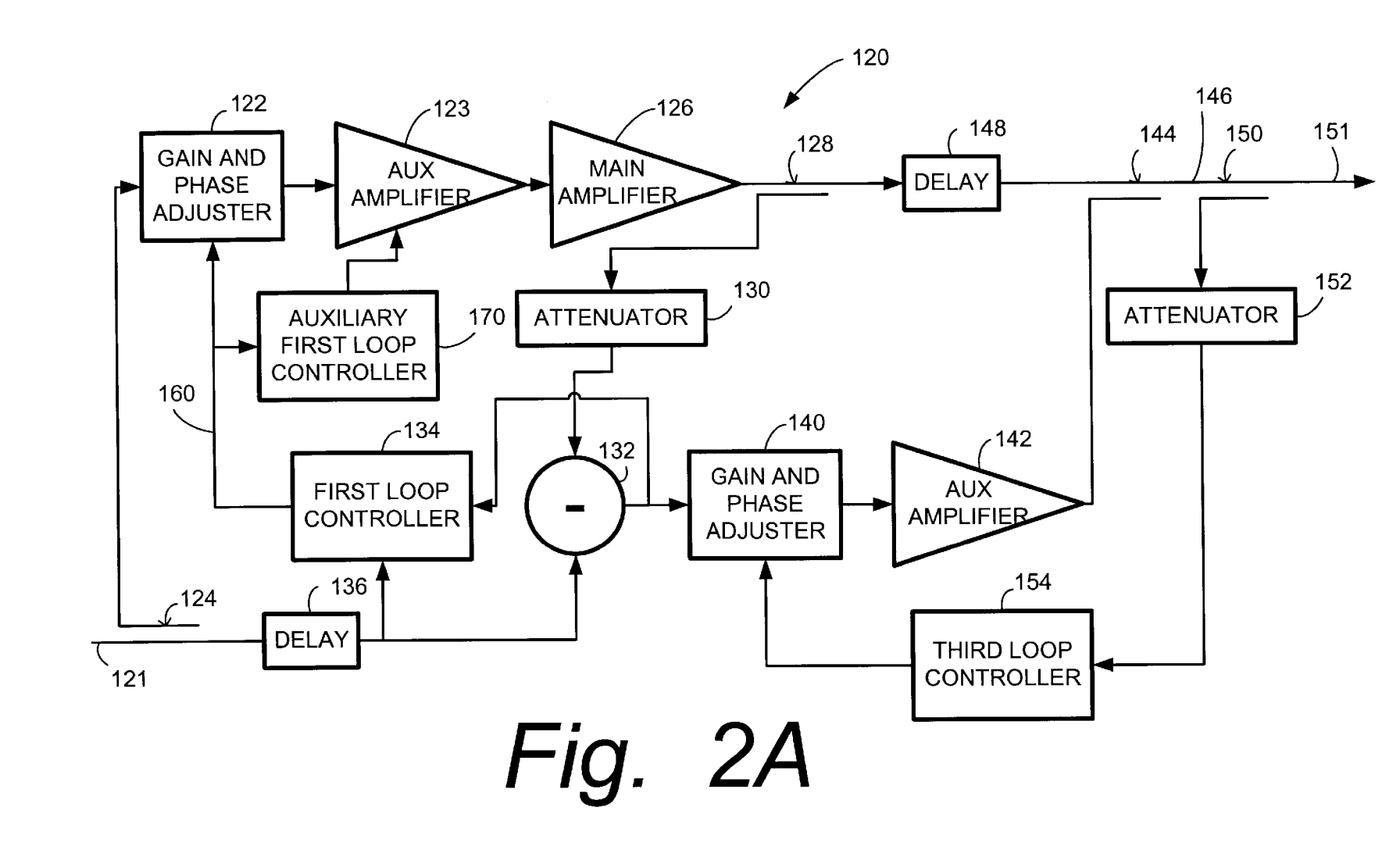
FIG. 2A is diagrammatic view of a non-limiting, first example amplifier system which employs a feedforward technique according to a noise reduction embodiment.

FIG. 2A shows a first example, non-limiting implementation of an amplifier system 120. Elements of amplifier system 120 which are analogous to corresponding elements of amplifier system 20 of FIG. 1 have similarly numbered lower order digits for their reference numerals. As with the amplifier system 20 of FIG. 1, the amplifier system 120 of FIG. 2A has three loops which serve comparable functions to the corresponding three loops of amplifier system 20.

The amplifier system 120 of FIG. 2A comprises a combination of phase and gain adjuster 122 and auxiliary amplifier 123. In the particular situation shown in FIG. 2A, the input side of phase and gain adjuster 122 is connected, via coupler 124, to receive an input signal applied at point 121. The phase and gain adjuster 122 can be a Cartesian phase and gain adjuster. An output side of phase and gain adjuster 122 is connected to the auxiliary amplifier 123, such as a variable gain auxiliary amplifier. An output side of variable gain auxiliary amplifier 123 is connected to an input side of main power amplifier 126. In view of the sequence of arrangement, the variable gain auxiliary amplifier 123 is also termed the "first" amplifier and the main amplifier 126 is also termed the "second" amplifier.

The phase and gain adjuster 122 and variable gain auxiliary amplifier 123 are described as being in combination in that they are ultimately connected to one another, e.g., the output terminal of one of phase and gain adjuster 122 and variable gain auxiliary amplifier 123 is connected to the input terminal of the other of phase and gain adjuster 122 and variable gain auxiliary amplifier 123. In the FIG. 2A example, the output terminal of phase and gain adjuster 122 is connected to the input terminal of variable gain auxiliary amplifier 123. The term "combination" does not preclude the possibility that other elements may be connected intermediate phase and gain adjuster 122 and variable gain auxiliary amplifier 123.

The output side of main power amplifier 126 is applied to coupler 128, and from one leg of coupler 128 via attenuator 130 to subtractor 132. The attenuator 130 reduces the gain of the signal output by main power amplifier 126 by an amount corresponding to the gain provided by main power amplifier 126.

Both subtractor 132 and controller 134 (also known as a first controller) receive, via delay 136, the input signal from point 121 as obtained from coupler 124. An output side of subtractor 132 is connected both to an input of first loop controller 134 and to a second gain and phase adjuster 140. An output side of gain and phase adjuster 140 is connected to an input side of auxiliary amplifier 142. The amplified output of auxiliary amplifier 142 is coupled by coupler 144 to line 146. Line 146 is connected via delay 148 and coupler 128 to the output side of main power amplifier 126.

The output signal carried on line 146 at point 151 is applied via coupler 150 and attenuator 152 to third loop controller 154. The third loop controller 154 is connected to control gain and phase controller 140.

The first loop controller 134 is connected to receive the input signal applied at point 121 (received via coupler 124 and delay 136) and the error signal generated by subtractor 132. An output side of first loop controller 134 is connected both to phase and gain adjuster 122 and to an input side of a second controller, e.g., auxiliary first loop controller 170. An output side of auxiliary first loop controller 170 is connected to a control side or terminal of variable gain auxiliary amplifier 123.

A first loop of amplifier system 120 includes phase and gain adjuster 122, variable gain auxiliary amplifier 123, main power amplifier 126, coupler 128, attenuator 130, and subtractor 132. The subtractor 132 compares the attenuated output of main power amplifier 126 with the input signal acquired via delay 136. The length of delay afforded by delay 136 corresponds to the delay through phase and gain adjuster 122, variable gain auxiliary amplifier 123, main power amplifier 126, and attenuator 130. If the gain and phase shift through phase and gain adjuster 122, variable gain auxiliary amplifier 123, main power amplifier 126, and attenuator 130 equals the gain and phase shift through delay 136, an error signal indicative of the distortion of main power amplifier 126 is output by subtractor 132. In the first loop, adjustment of the amplitude and phase matching is performed by phase and gain adjuster 122, working together (as hereinafter described) with variable gain auxiliary amplifier 123 and auxiliary first loop controller 170.

A second loop of amplifier system 120, which serves as a distortion compensation circuit, comprises attenuator 130, subtractor 132, gain and phase controller 140, auxiliary amplifier 142, coupler 144, and delay 148. If the gain and phase shift through attenuator 130, subtractor 132, gain and phase controller 140, and auxiliary amplifier 142 on the one hand equals the gain and phase shift through delay 148 on the other hand, except for a 180 degree phase shift, the distortion is added in opposite phase at coupler 144, thus canceling out the distortion of main power amplifier 126 on line 146.

To ensure phase and gain equality in the path on line 146 and the path through attenuator 130, subtractor 132, gain and phase controller 140, and auxiliary amplifier 142, controller 154 generates control signals which are applied to gain and phase adjuster 140. In this regard, as a third loop, controller 154 uses the signal at point 151, reduced by attenuator 152, to generate the control signals applied to gain and phase controller 140.

First loop controller 134 produces control signals (also referred to as the "first" control signal or "first" control signals) applied on line 160 to phase and gain adjuster 122 and to auxiliary first loop controller 170. These control signals are set by first loop controller 134 to equalize gain and phase shift through (1) the path of the input signal to subtractor 132 via delay 136; and (2) the path through phase and gain adjuster 122, variable gain auxiliary amplifier 123, main power amplifier 126, coupler 128, and attenuator 130 to subtractor 132. Thus, the first controller 134 uses a signal derived from the second amplified signal (e.g., the signal output by main amplifier 126) to generate the first control signal, the first control signal being applied to the phase and gain adjuster to control the gain of the phase and gain adjuster 122. Regarding such derivation, it will be recalled that the output side of main power amplifier 126 is applied to coupler 128, and from one leg of coupler 128 via attenuator 130 to subtractor 132 and to first loop controller 134. Processing of the output signal of the main amplifier using an attenuator and subtractor is just one non-limiting example of how a signal can be derived from the second amplified signal.

The control signals output by first loop controller 134 which are applied on line 160 comprise control information in Cartesian (or complex) form for phase and gain adjuster 122. The control signals can be conceptualized as a two-directional vector that controls the (complex) gain of phase and gain adjuster 122. For example, the control signal output by first loop controller 134 can have the complex form Ictrl+j*Qctrl. The control signals output by first loop controller 134 can be carried either by voltages and/or current. The complex gain of phase and gain adjuster 122 is linearly dependent of the complex control signal output by first loop controller 134.

As mentioned above, the control signals generated by first loop controller 134 are also applied on line 160 to auxiliary first loop controller 170. The variable gain auxiliary amplifier 123 acts as a slave to the phase and gain adjuster 122. The first loop (which includes the phase and gain adjuster 122) is the main loop adjuster and takes care of the fast gain variations, while the variable gain auxiliary amplifier 123 helps the phase and gain adjuster 122 to work in an optimal way. In this regard, the auxiliary first loop controller 170 monitors the control signals output by the first loop controller 134 to the phase and gain adjuster 122 and tries, together with the variable gain auxiliary amplifier 123, to keep the control signals generated by first loop controller 134 essentially constant, e.g., to a predetermined value or within a predetermined range of values. To this end, the auxiliary first loop controller 170 low pass filters and uses any perturbation from the predetermined value (or range of values) to generate a "second" control signal. This second control signal is applied to variable gain auxiliary amplifier 123 to either decrease or increase the gain of variable gain auxiliary amplifier 123. The second control signal output from the auxiliary first loop controller 170 (also conceptualized as a control vector) is either a voltage and/or current for controlling the gain of the variable gain auxiliary amplifier 123. The variable gain auxiliary amplifier 123 and auxiliary first loop controller 170 are thus part of a control system, with the input to this control system being the first control signal (e.g., control vector) output from auxiliary first loop controller 170. As mentioned above, the auxiliary first loop controller 170 receives the control vector output of first loop controller 134 on line 160, and produces an output signal (also a control vector) applied to variable gain auxiliary amplifier 123. For example, when the gain of phase and gain adjuster 122 is low, the control signal generated by first loop controller 134 on line 160 decreases. In such case, the output of auxiliary first loop controller 170 also decreases, thereby decreasing the gain of the variable gain auxiliary amplifier 123. The decrease in gain of the variable gain auxiliary amplifier 123, in turn, decreases the signal output by main amplifier 125. The decrease in the output signal from main amplifier 125 causes the first loop controller 134 to generate a control signal that will increase the gain of phase and gain adjuster 122. The converse example (when the gain of phase and gain adjuster 122 is high) results in the 170 increasing its output vector to variable gain auxiliary amplifier 123, with the result that the output signal of main amplifier 125 is increased, which causes the first loop controller 134 to generate control signals on line 160 which lower or decrease the gain of phase and gain adjuster 122.

Those skilled in the art will appreciate that the functions of auxiliary first loop controller 170 may be implemented using individual hardware circuits, using software functioning in conjunction with a suitably programmed digital microprocessor or general purpose computer, using an application specific integrated circuit (ASIC), and/or using one or more digital signal processors (DSPs).

The variable gain auxiliary amplifier 123 itself can be a conventional and thereby comprise, e.g., amplifying elements such as transistors with resistors and (in some cases) capacitors. The gain of the variable gain auxiliary amplifier 123 can adjusted be by an applied external signal such as a voltage or current, as is the case for the control signal applied to variable gain auxiliary amplifier 123 by auxiliary first loop controller 170. A common type of variable gain amplifier suitable as an example for variable gain auxiliary amplifier 123 is a so-called Gilbert cell.

As an illustrative implementation of the FIG. 2A structure, assume that only 2 dB of control range of the amplifier system 120 is allocated to phase and gain adjuster 122, and the remainder (e.g., 4 dB) is allocated to variable gain auxiliary amplifier 123. The output signal to noise ratio for system 120 is then (for the worst case) 148 dB for phase and gain adjuster 122 and 154 dB for variable gain auxiliary amplifier 123. The combined (total) signal to noise ratio is then 147 dB, which favorably compares to the 144 dB which otherwise would be the case with the phase and gain adjuster 122 alone (without the auxiliary first loop controller 170 and the variable gain auxiliary amplifier 123).

In an amplifier system such as that described in FIG. 2A, the phase and gain adjuster 122 adjusts the adjusted signal to make adjustments for a first type of gain variation of the amplifier system, whereas the variable gain auxiliary amplifier 123 changes its first amplified signal to make adjustments for a second type of gain variation of the amplifier system. For example, the phase and gain adjuster 122 takes care of the fast but relatively small gain variations of the amplifier system 120, whereas the variable gain auxiliary amplifier 123 accommodates to the slow gain variations of the amplifier system 120 such as those attributable to production differences, aging, or temperature variations.

Figure 2B:
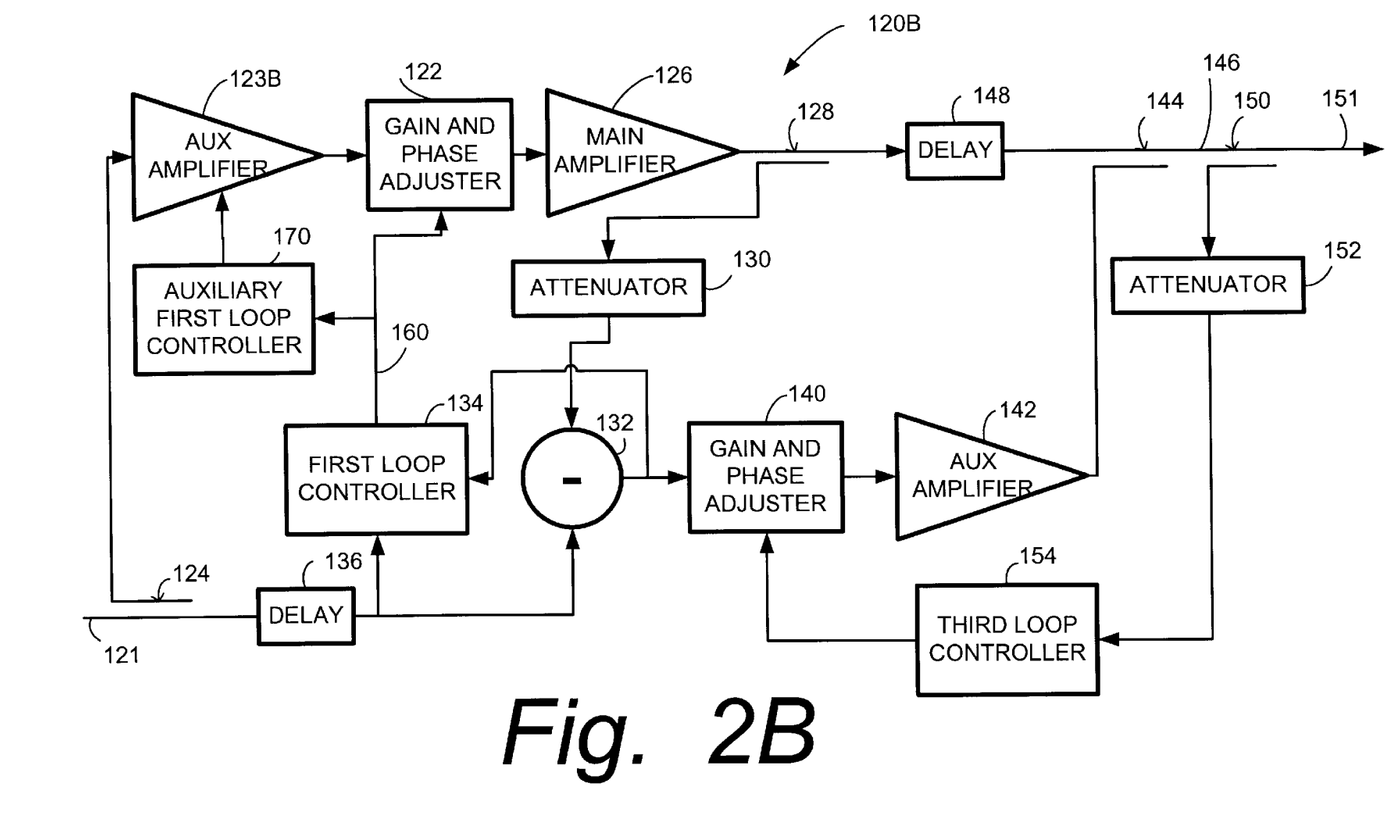
FIG. 2B is diagrammatic view of a non-limiting, second example amplifier system which employs a feedforward technique according to a noise reduction embodiment.

FIG. 2B shows a second example, non-limiting implementation of an amplifier system 120B. The system of FIG. 2B basically differs from the system of FIG. 2A in that the variable gain auxiliary amplifier 123B is situated before phase and gain adjuster 122 rather than after phase and gain adjuster 122. That is, in the combination of phase and gain adjuster 122 and variable gain auxiliary amplifier 123 shown in FIG. 2B, the output terminal of variable gain auxiliary amplifier 123 is connected to the input terminal of phase and gain adjuster 122. The preceding considerations discussed with respect to the system of FIG. 2A are essentially equally applicable to the system of FIG. 2B. Elements of amplifier system 120B of FIG. 2B which are analogous to corresponding elements of amplifier system 120 of FIG. 2A are similarly numbered.

The foregoing is significant in various applications, such as (for example) wireless telephony. In this regard, specifications for mobile phone systems typically restrict the amount of noise produced by a transmitter outside the transmitting channel, especially in the receiving band. If the undesired noise can be sufficiently limited, costly and space consuming noise rejection filters can be avoided.

In one example mode of operation, the output signal from auxiliary first loop controller 170 and applied to variable gain auxiliary amplifier 123 is generated to keep the magnitude of the input control vector (applied on line 160 to phase and gain adjuster 122) essentially constant (e.g., equal to a predetermined value). In other words, for the control signal applied on line 160, the quantity of Expression 1 is held constant. Concerning Expression 1, it will be recalled that the control signal output by first loop controller 134 can have the complex form Ictrl+j*Qctrl.

Expression 1

$$\text{SQUARE ROOT}(Ictrl^2 + Qctrl^2)$$

Figure 3:
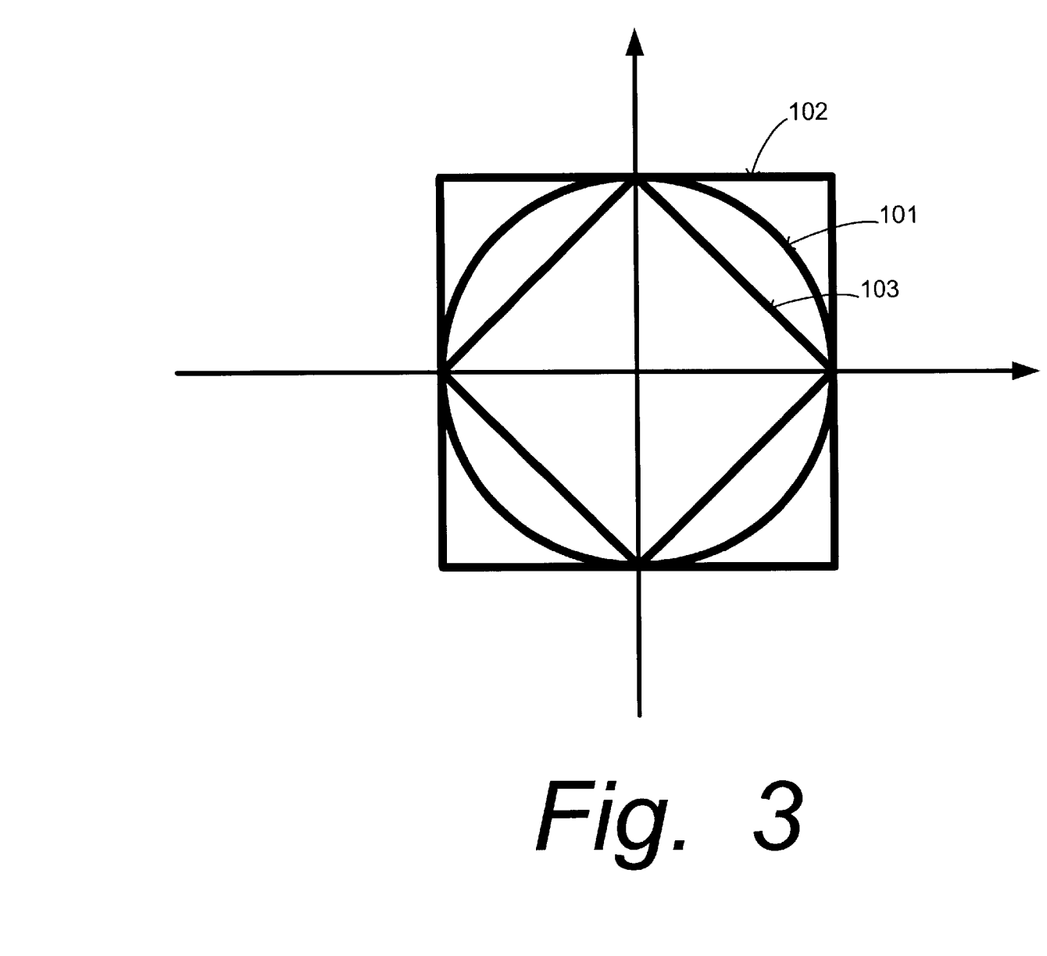
FIG. 3 is complex gain plane graph showing complex gain control characteristics of various modes of noise reduction utilizing the example embodiments of FIG. 2A and FIG. 2B.

This first mode, the average gain of the phase and gain adjuster 122 describes a circle 101 in the complex gain plane (e.g., provides a control characteristic depicted by line 101 in FIG. 1). The area within the (circle) line 101 in FIG. 3 represents the complex gain control area of phase and gain adjuster 122 in accordance with this first mode. Squaring and root extraction can be accomplished in a number of ways, for example using translinear techniques.

Figure 4:
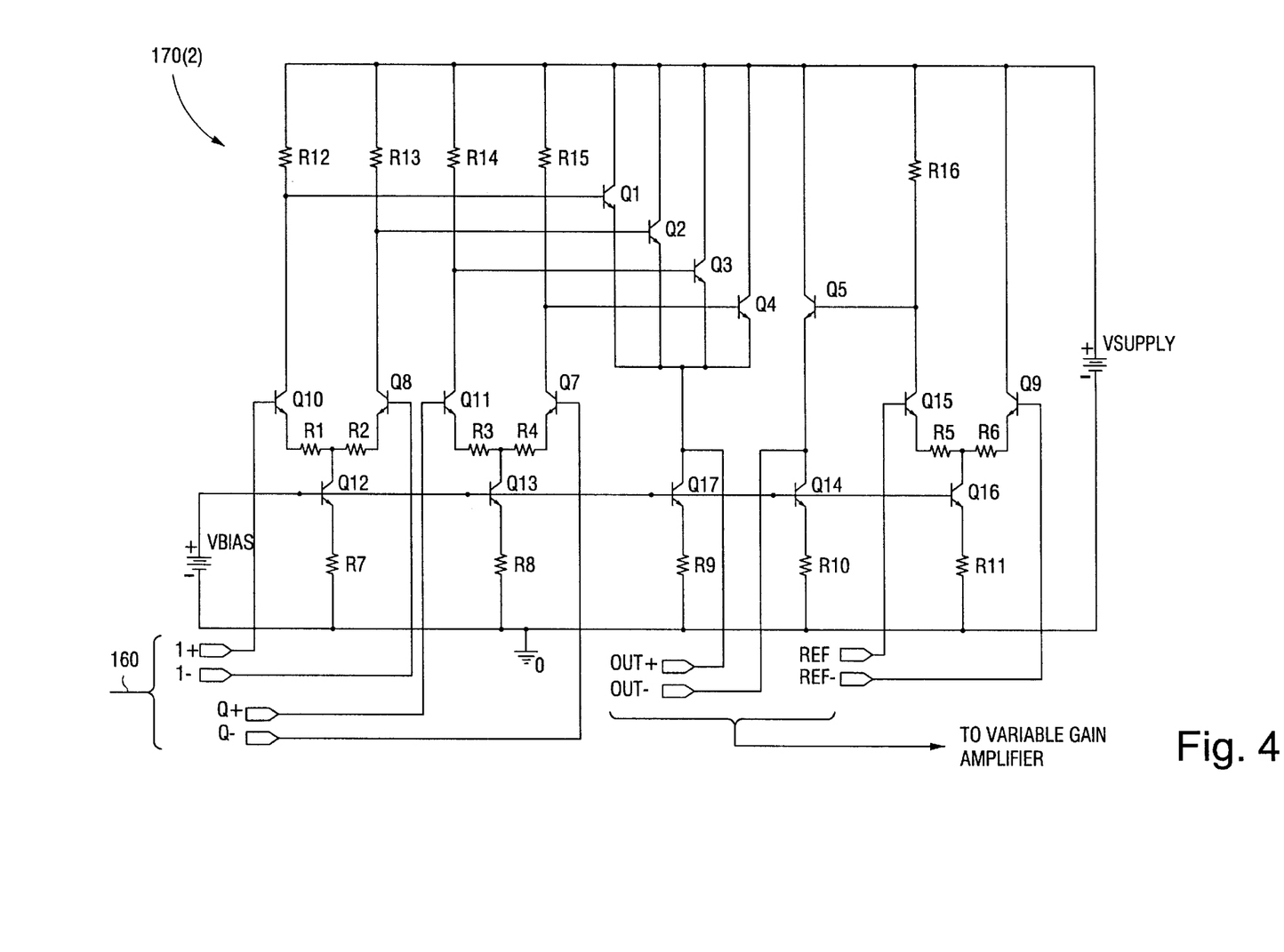
FIG. 4 is a schematic view of a circuit reflecting logic performed by an auxiliary first loop controller in implementing one example mode of operation.

Since implementation of Expression 1 of the first mode can be challenging, other modes may be preferable for some applications. In another example mode of operation, the auxiliary first loop controller 170 generates its output control signal for application to variable gain auxiliary amplifier 123 so that first loop controller 134 generates the control signal applied on line 160 to phase and gain adjuster 122 to be a constant, the constant being the largest of the absolute values of the two orthogonal components, e.g., the largest of |Ictrl| and |Qctrl|. In other words, an absolute value of a largest component of the first control signal is maintained essentially constant. The circuit shown 120(2) in FIG. 4 reflects logic suitable for use by auxiliary first loop controller (e.g., second controller) for generating its (second) control signal in accordance with this second example mode. This second mode provides a control characteristic depicted by line 102 in FIG. 3, e.g., the complex gain describes square 102. The area within the line 102 in FIG. 3 represents the complex gain control area of phase and gain adjuster 122 in accordance with this second mode.

In another or third example mode of operation, the auxiliary first loop controller 170 generates a control signal for application to variable gain auxiliary amplifier 123 which will result in the first loop controller 134 generating a control vector which holds constant a sum of the absolute values of the two orthogonal components (e.g., |Ictrl|+|Qctrl| is held constant. That is, the second controller 170 generates the second control signal so that a sum of absolute values of components the first control signal is maintained essentially constant. This third mode provides a control characteristic depicted by line 103 in FIG. 3, e.g., the gain in the complex plane describes a rhomboid. The area within the line 103 in FIG. 3 represents the complex gain control area of phase and gain adjuster 122 in accordance with this third mode.

As can be seen from FIG. 3, the second mode more optimally utilizes the complex gain control area of phase and gain adjuster 122.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An amplifier system for radio frequency signals comprising:
   a combination comprising a phase and gain adjuster connected to a first amplifier; the combination receiving an input signal and generating a first amplified signal;
   a main amplifier which receives the first amplified signal and generates a second amplified signal;
   a first controller which uses a signal derived from the second amplified signal to generate a first control signal which is applied to the phase and gain adjuster to control gain of the phase and gain adjuster;
   a second controller connected to receive the first control signal and to generate a second control signal which is applied to the first amplifier, the second control signal being generated to control the first control signal.

2. The apparatus of claim 1, wherein the second control signal is generated to control noise of the amplifier system.

3. The apparatus of claim 1, wherein the second controller generates the second control signal so that the first control signal is maintained essentially constant.

4. The apparatus of claim 1, wherein the second controller generates the second control signal so that a magnitude of the first control signal is maintained essentially constant.

5. The apparatus of claim 1, wherein the second controller generates the second control signal so that a sum of absolute values of components the first control signal is maintained essentially constant.

6. The apparatus of claim 1, wherein the second controller generates the second control signal so that an absolute value of a largest component of the first control signal is maintained essentially constant.

7. The apparatus of claim 1, wherein the phase and gain adjuster adjusts the adjusted signal to make adjustments for a first type of gain variation of the amplifier system, and wherein the first amplifier changes its first amplified signal to make adjustments for a second type of gain variation of the amplifier system.

8. The apparatus of claim 7, wherein the first type of gain variation is a fast gain variation and the second type of gain variation is a slow gain variation.

9. The apparatus of claim 7, wherein the second type of gain variation is a gain variation attributable to one of amplifier system production differences, aging, and temperature variations.

10. The apparatus of claim 1, wherein the first amplifier is a variable gain auxiliary amplifier.

11. The apparatus of claim 1, further comprising:
    means for producing an error signal indicative of distortion of the main amplifier;
    a distortion compensation circuit which uses the error signal essentially to cancel the distortion of the main amplifier in the second amplified signal.

12. For use in an amplifier system for radio frequency signals, a method comprising:
    with respect to an input signal, using a combination of a phase and gain adjuster and a first amplifier to obtain a first amplified signal, including using the first amplifier to perform a first amplification;
    performing a second amplification with a main amplifier which receives the first amplified signal and generates a second amplified signal;
    using a signal derived from the second amplified signal to generate a first control signal;
    applying the first control signal to the phase and gain adjuster to control the gain of the phase and gain adjuster;
    using the first control signal to generate a second control signal;
    using the second control signal to control the first control signal.

13. The method of claim 12, further comprising generating the second control signal to control noise of the amplifier system.

14. The method of claim 12, further comprising generating the second control signal so that the first control signal is maintained essentially constant.

15. The method of claim 12, further comprising generating the second control signal so that a magnitude of the first control signal is maintained essentially constant.

16. The method of claim 12, further comprising generating the second control signal so that a sum of absolute values of components the first control signal is maintained essentially constant.

17. The method of claim 12, further comprising generating the second control signal so that an absolute value of a largest component of the first control signal is maintained essentially constant.

18. The method of claim 12, wherein the phase and gain adjuster adjusts the adjusted signal to make adjustments for a first type of gain variation of the amplifier system, and wherein the first amplifier changes its first amplified signal to make adjustments for a second type of gain variation of the amplifier system.

19. The method of claim 18, wherein the first type of gain variation is a fast gain variation and the second type of gain variation is a slow gain variation.

20. The method of claim 18, wherein the second type of gain variation is a gain variation attributable to one of amplifier system production differences, aging, and temperature variations.

21. The method of claim 12, further comprising using a variable gain auxiliary amplifier as the first amplifier.

22. The method of claim 12, further comprising:
producing an error signal indicative of distortion of the main amplifier;
using the error signal essentially to cancel the distortion of the main amplifier in the second amplified signal.

* * * * *